United States Patent [19]

Miltonberger

[11] Patent Number: 4,499,610
[45] Date of Patent: Feb. 12, 1985

[54] FEEDBACK SYSTEM WITH AUTOMATIC GAIN CONTROL ACTION

[75] Inventor: Thomas W. Miltonberger, Grayslake, Ill.

[73] Assignee: Gould Inc., Rolling Meadows, Ill.

[21] Appl. No.: 509,751

[22] Filed: Jun. 30, 1983

[51] Int. Cl.³ .............................................. H04B 9/00
[52] U.S. Cl. .................................... 455/619; 455/612; 367/901
[58] Field of Search ............... 455/115, 126, 606, 607, 455/609, 611, 613, 617, 618, 610, 612, 619; 332/7.51; 372/29, 31, 33; 324/140 D; 367/124, 126, 901; 364/517, 819

[56] References Cited

U.S. PATENT DOCUMENTS

| | | | |
|---|---|---|---|
| 2,747,796 | 5/1956 | Patterson | 324/140 D |
| 4,283,767 | 8/1981 | Rountree | 367/901 |
| 4,292,606 | 9/1981 | Trimmel | 455/613 |
| 4,294,513 | 10/1981 | Nelson et al. | 455/612 |

*Primary Examiner*—Joseph A. Orsino, Jr.

*Attorney, Agent, or Firm*—John R. Garrett; Edward E. Sachs; K. H. Pierce

[57] ABSTRACT

The invention described herein is a feedback device for canceling noise from a monitoring device having a reference signal and a modulated signal wherein the modulated signal is modulated by a high-frequency modulation signal to be monitored. The invention includes a summing junction, a first means for receiving the reference and the modulated signals and subtracting the logarithmic value of one signal from another to produce a first signal to the summing junction representing the logarithmic difference between the reference and modulated signals, and a feedback loop in electrical connection with the summing junction. The loop has an analog means for receiving the first signal and producing an analog signal therefrom. The loop also includes a low-pass filter for receiving the analog signal and filtering any high-frequency portion contained therein to produce a second signal to the summing junction. The second signal is out of phase by 180 degrees with the first signal.

4 Claims, 4 Drawing Figures

FEEDBACK SYSTEM WITH AUTOMATIC GAIN CONTROL ACTION

BACKGROUND OF THE INVENTION

A. Field of the Invention

The present invention relates generally to feedback devices and more specifically relates to logarithmic feedback devices for filtering noise from an optical monitoring device.

B. Description of the Prior Art

In certain applications, it is desirable to monitor a small-amplitude, high-frequency signal which is carried by a signal also having a large-amplitude, low-frequency component. For example, laser optic devices for monitoring acoustic signals in ocean systems frequently contain relatively large-amplitude, low-frequency noise due to thermal effects from a laser signal source or related sensing apparatus. Such a system is illustrated in FIG. 1 in which a laser device 6 produces a signal which is split into two components by an optical coupler or a beamsplitter 7 to provide two signals. One signal is simply a reference signal, while the other signal is passed through a modulation means 8 to produce a modulated signal. In such an application, the signal to be detected has an amplitude below that of the random variations in optical power admitted by the typical laser. If an optical coupler were perfect and did not include problems with drift and noise, it would be possible to measure the signal to be monitored by directly compensating the modulated signal which has been acoustically modulated by the parameter to be measured with a reference signal emanating from the same source as the modulated signal prior to modulation. This situation is represented by equation 1 below:

$$\frac{V_{mod}}{V_{ref}} = \frac{I_E(1-M)}{I_E} = 1 - M \qquad \text{Eq. 1}$$

Where:

$V_{mod}$ = the voltage of the modulated signal;
$V_{ref}$ = the voltage of the reference signal;
$I_E$ = the intensity of the optical signal from a laser or other signal source; and
$M$ = the modulation produced in the optical signal by the signal to be monitored.

As a practical matter, however, optical couplers and the system configuration are not ideal, and they exhibit low-frequency changes during operation. These changes are caused, in part, by thermal fluctuations in the coupler during operation. The effects of these fluctuations, commonly identified as drift, along with laser fluctuations result in what is commonly referred to as a fading channel, may be described as follows:

$$\frac{V_{mod}}{V_{ref}} = \frac{F_1}{F_2}(1-M). \qquad \text{Eq. 2}$$

where:

$F_1$ = fading induced in the modulated signal primarily due to coupler drift and fiber bending; and
$F_2$ = fading induced in the reference signal.

In the laser system of the subject invention, the fading factors $F_1$ and $F_2$ have relatively large-amplitude effects compared to the modulation factor M. It is therefore impossible to determine changes in amplitude of the modulated factor, M, directly from the output described above. One possible solution to eliminate the relatively large fading effects would be to adjust the gain of both the modulated signal and the reference signal to compensate for fading through the use of an automatic gain control device. This would eliminate the influence of $F_1$ and $F_2$ factors in equation 2. Conventional methods to perform this operation are illustrated in FIG. 2. In this system, separate automatic-gain-control (AGC) devices 9 and 11 are used to compensate both the reference signal and the modulated signal to eliminate the fading factors $F_1$ and $F_2$. In the system illustrated in FIG. 2, the automatic-gain-control devices 9 and 11 produce the inverse of fading factors $F_1$ and $F_2$ such that when the modulated signal is divided by the reference signal through dividing means 13, an output signal of (1-M) is produced. One problem with the system illustrated in FIG. 2 is that each automatic gain control device 9, 11, may introduce its own noise factor into the system. Furthermore, the noise factors produced by automatic gain control devices 9, 11, may be unequal to each other which further complicates interpretation of the output signal.

SUMMARY OF THE INVENTION

It is an object of the present invention to provide an automatic gain control device which induces minimal noise to the system.

It is a further object of the invention to provide an automatic gain control device which is relatively simple in design.

It is still another object of the present invention to provide a single automatic gain control device capable of compensating for fading in both the reference and modulated signals.

Other objects, advantages, and novel features of the present invention will become apparent from the following detailed description of the invention when considered in conjunction with the accompanying drawings.

The invention described herein comprehends a feedback device for cancelling high-frequency noise and low-frequency fading from a high-frequency monitoring device in which the monitoring device includes a reference signal and a modulated signal. The modulated signal differs from the reference signal by a high-frequency modulation signal to be monitored and by low-frequency fading. The present invention comprehends that the feedback device includes a summing junction including two input signals. Each input signal represents the logarithmic equivalent of the voltage output from the monitoring device representing the reference and modulated signals. The feedback device further comprehends the use of a feedback loop in conjunction with the summing junction. The feedback loop includes an antilogging means for producing the antilog of the voltage present at the summing junction. The feedback loop further includes an adjustable bias means for producing a bias voltage. The feedback loop also includes a differential means for producing a voltage proportional to the difference in voltage between the adjustable bias means and the antilogging means to produce a differential output signal. A low-pass filter is also included in the feedback loop to pass low-frequency signals and block high-frequency signals from the differential output signal and to produce a feedback signal to the summing junction.

DETAILED DESCRIPTION OF THE PREFERRED EMBODIMENT

Figure 1:
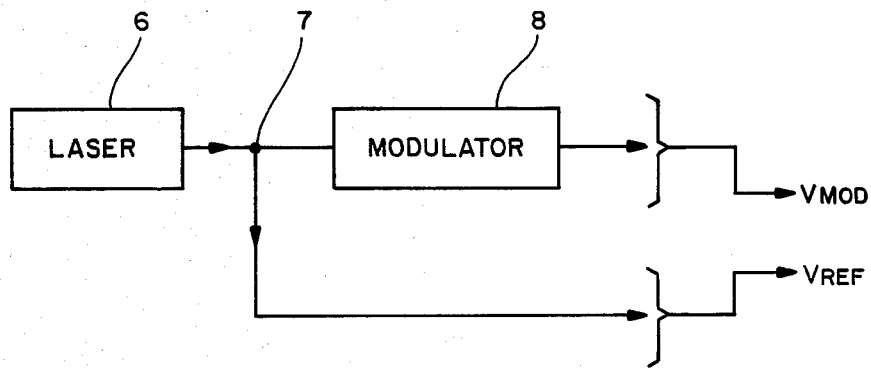
FIG. 1 is a block diagram illustrating a laser monitoring system having two outputs, one of which is a reference signal and the other of which is a modulated signal.
Figure 2:
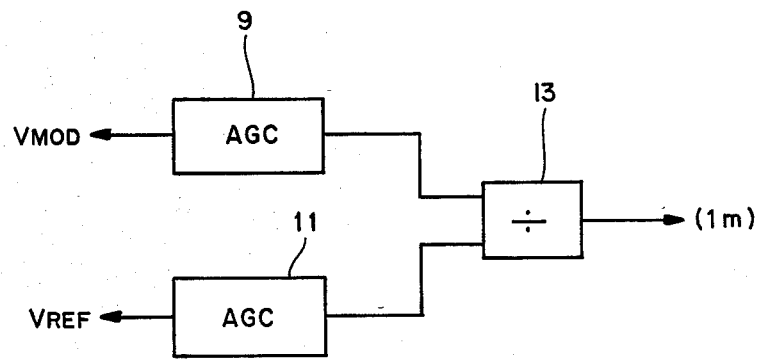
FIG. 2 is a block diagram illustrating a conventional method for providing automatic gain control to the system of FIG. 1.
Figure 3:
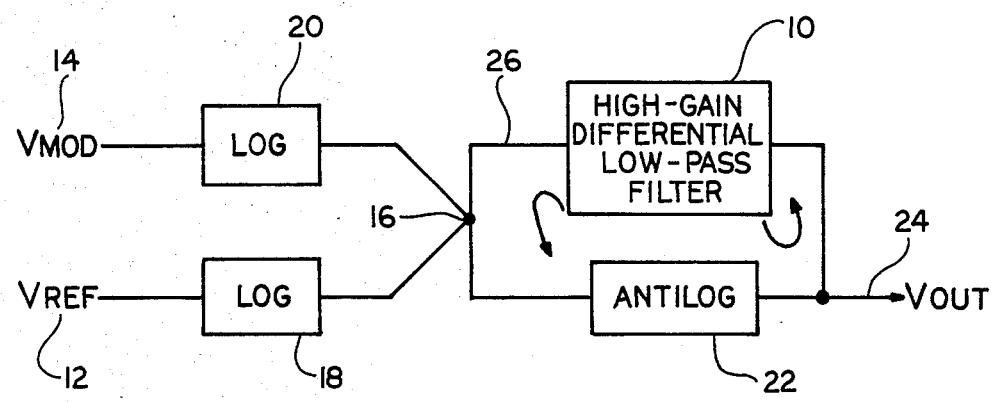
FIG. 3 is a simplified block diagram of the subject invention.

As discussed above, one feature of the present invention is the provision of a single automatic gain control device to compensate for fading in both a reference signal and a modulated signal. As illustrated in FIG. 3, the subject invention teaches that a low-pass filter 10 may be used to eliminate fading from a reference voltage 12 and a modulated voltage 14 through a summing junction 16.

Referring again to FIG. 3, both the reference 12 and modulated 14 voltages are passed through logarithmic devices 18 and 20, respectively, to produce signals representing the logarithmic value of the reference and modulated signals. Either logarithmic device 18 or 20 operates to inverse the value of its logarithmic signal. In this example, the logarithmic value of the reference signal is inverted. The inverted logarithmic value of the reference voltage and the logarithmic value of the modulated voltage are passed to summing junction 16 to create a voltage representing the logarithmic difference between the modulated and reference signals. From the summing junction 16, the logarithmic difference signal is passed through an antilog device 22 so that an output voltage signal 24 may be obtained. The output voltage signal 24 is fed into a high-gain differential, low-pass filter 10 which compensates for any low-frequency noise or low-frequency drift in the output signal. The feedback signal 26 is fed into summing junction 16 to compensate for low-frequency noise in the system.

Figure 4:
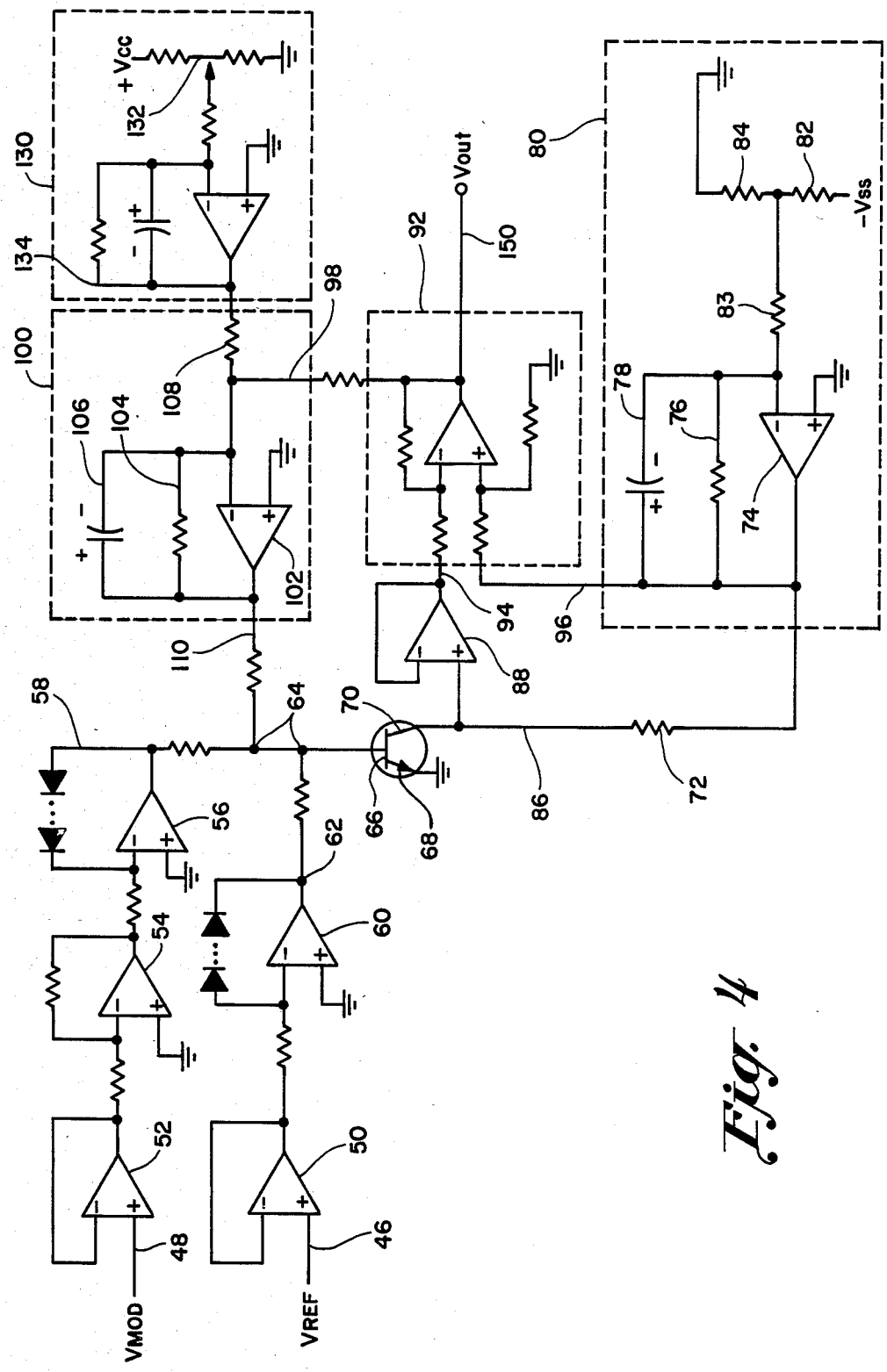
FIG. 4 is a circuit diagram of the subject invention.

Referring now to FIG. 4 which is a circuit diagram of the preferred embodiment of the present invention, the voltage of the reference signal appears on line 46, and the voltage of the modulated signal appears on line 48. Each signal is fed through its respective unity gain buffers 50 and 52. In the preferred embodiment either the modulated signal or the reference signal is inverted. In this particular example illustrated in FIG. 4, the modulated signal is inverted by analog inverter 54. For purposes of future discussions in a conventional manner, the output from analog inverter 54 will be referred to as $-V_{mod}$. The output from analog inverter 54 is fed into a logarithmic amplifier 56 which, by nature of the logarithmic amplifier, inverts the signal again to produce an output signal 58 corresponding to $+\log V_{mod}$. Similarly, the output signal from unity buffer 50 representing the voltage of the reference signal is passed through logarithmic amplifier 60 to produce an output signal 62 corresponding to $-\log V_{ref}$. Thus, at summing junction 64, the input signals 58 and 62 to the summing junction 64 represent the logarithmic difference between the voltage of the modulated signal and the voltage of the reference signal. The voltage at summing junction 64 is fed into the base 66 of antilogging device 68. In the illustrated embodiment, the antilogging device 68 is a bipolar transistor. Those skilled in the art will readily recognize that logging and antilogging devices are very sensitive. The more current which passes through such a device, the more the device tends to self-heat. Logging devices, used in applications such as logging devices 56 and 60, do not pass significant current and do not have a strong tendency to self-heat. On the other hand, antilogging devices used in applications such as antilogging device 68 would in conventional automatic gain control devices pass significant current so that heating would be a problem. The current into collector 70 of antilogging device 68 is an exponential of the voltage at the base 66. A voltage difference across resistor 72 is proportional to this collector current.

Amplifier 74 with parallel resistor 76 and capacitor 78 altogether form a low-noise, low-drift voltage source 80 in conjunction with resistors 82–84 and voltage source ($-V_{SS}$) to supply a constant voltage to resistor 72. Resistor components are used to supply power to resistor 72 to correct the magnitude of $-V_{SS}$ because the power supply to resistor 82 is critical and any variations in voltage need to be eliminated.

The voltage line 86 is fed into unity buffer 88 which extracts the voltage from line 86 without drawing current from the line to prevent altering the voltage in line 86. Unity buffer 88 provides voltage 90. Another input signal to differential amplifier 92 is provided by power supply 80 on line 96. The differential amplifier 92 computes the difference between input voltages at 96 and 94 and outputs the difference. This operation removes the dependence of the voltage at 90 on the voltage at 96. The output 150 of differential amplifier 92 on line 98 corresponds to the collector current of antilog device 68 which corresponds to the ratio of the voltage of the reference signal over the voltage of the modulated signal.

The output from the differential amplifier 92 is fed into a low-pass filter 100 which includes an amplifier 102, preferably a high-gain amplifier, a resistor 104 and a capacitor 106 and parallel with one another. The low-pass filter further includes resistor 108. Resistor 108 allows the controlled addition of a bias voltage out of adjustable power supply 130. Low-pass filter 100 passes low frequencies, i.e., the amplitude out of low-pass filter 100 at 110 is a function of the frequency of the input signal into the low-pass filter. For example, a high-frequency signal will produce a low amplitude signal at 110 from the low-pass filter, whereas a low-frequency signal will produce a high amplitude output signal at 110. Since by the operation of elements 68, 92 and 100, the phase signal at 64 is inverted an odd number of times, the low-frequency output signal of 110 is out of phase by 180 degrees with whatever low-frequency fading would be present at 64. Consequently, those two large-amplitude signals approximately cancel at 64, and the effects of low-frequency fading are compensated.

Since antilogging devices such as device 68 are very temperature sensitive, the subject invention comprehends the inclusion of a manually adjustable voltage source 130 within the feedback loop to adjust the operating point of antilogging device 68. In this manner, the overall gain of the circuit is a function of a potentiometer 132 included in the adjustable power supply 130. In the preferred embodiment illustrated in FIG. 4, the input voltage to low-pass filter 100 is the sum of the voltage ratio signal of the reference and modulated signals at 98 and adjustable constant voltage at 134.

Thus, the summing junction 64 receives an average voltage with respect to time in which low-pass filter 100 cancels low-frequency fading within the system, i.e., the voltage that is applied to summing junction 64 from low-pass filter 100 is a function of what passes through antilogging device 68 on line 86 with respect to low-frequency components but not with respect to high-frequency components.

The present invention is considered to be preferable to conventional automatic gain control devices because the present invention accomplishes automatic gain control and antilogging in the same device in such a way to hold the operating point of the device 68 substantially constant; this has several desirable results. For example, the present invention achieves simplicity in that the same device serves more than one function. Furthermore, the present development achieves greater stability in that the operating point of the antilogging device is held essentially constant thereby reducing resultant temperature dependent performance variations. The operating point of the anti-logging device 68 is held essentially constant through negative feedback through unity buffer 88, differential amplifier 92, and low-pass filter 100. As long as the ratio of the fading changes slowly, i.e., as long as it is a low-frequency relative fading, the d.c. bias voltage at the base of antilogging device 68 will tend to be held constant. Since the operating point of antilogging device 68 is held substantially the same, the gain on the antilogging device is also substantially the same. Since the result of low-frequency fading in the ratio of noise in the modulated and reference signals would normally have changed the low-frequency signal gain of the antilogging device, in effect the antilogging device has been gain compensated by the feedback voltage supplied by low-pass filter 100. Thus, automatic gain control is achieved.

Although the invention has been described and illustrated in detail, it is to be clearly understood that the same is by way of invention example only, and not to be taken by way of limitation; the spirit and scope of this invention being limited only by the terms of the appended claims.

What is claimed is:

1. A feedback device for cancelling low-frequency noise from a reference signal and a high frequency modulated signal from a monitoring device wherein said modulated signal and/or said reference signal is further modulated by a low-frequency modulation signal, comprising:

first means for receiving said reference and said modulated signals and for producing a first signal which is a logarithmic value of one of said reference signal or said modulated signal and a second signal which is a negative logarithmic value of the other of said reference signal or said modulated signal; and a summing junction operatively connected to said first means, said summing junction receiving said first and second signals from said first means and producing a logarithmic difference signal therefrom; and a feedback loop in electrical connection with said summing junction, said loop having an antilog means for receiving at least said logarithmic difference signal and producing an antilog signal therefrom, and a high-gain differential, low-pass filter for receiving said antilog signal on an input thereof and filtering any high-frequency portion contained therein to present a third signal to said summing junction, said third signal being out of phase with said logarithmic difference signal by 180 degrees;

wherein said antilog signal is an output signal which is related to the ratio of said modulated signal to said reference signal and wherein any low frequency modulation in said modulated and/or reference signals has been substantially removed from said output signal so that the high frequency modulated signal can be measured.

2. A feedback device as recited in claim 1, wherein said high-gain differential, low-pass filter includes a high gain amplifier with a feedback circuit having a resistor and capacitor in parallel with one another.

3. A feedback device as recited in claim 1, wherein said antilog means includes a bipolar transistor to received at least said logarithmic difference signal and to produce said antilog signal therefrom.

4. A feedback device as described in claim 3 wherein said feedback device further comprises an adjustable voltage source for presenting an adjustable constant voltage signal to said input of said high-gain differential, low-pass filter and combining with said antilog signal, thereby setting the operating point of said bipolar transistor at a level to limit the current through the bipolar transistor to prevent over heating.

* * * * *